United States Patent
Maas et al.

(10) Patent No.: US 10,980,117 B1
(45) Date of Patent: Apr. 13, 2021

(54) MID-PLANE BOARD FOR COUPLING MULTIPLE CIRCUIT FRAMES IN A CIRCUIT EMULATOR ENGINE

(71) Applicant: Cadence Design Systems, Inc., San Jose, CA (US)

(72) Inventors: Gidon Maas, San Jose, CA (US); Pinchas Herman, San Jose, CA (US); Vu Nguyen, San Jose, CA (US); Hoa Pham, San Jose, CA (US); Febin George, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 192 days.

(21) Appl. No.: 16/218,158

(22) Filed: Dec. 12, 2018

(51) Int. Cl.
| | |
|---|---|
| *H05K 1/00* | (2006.01) |
| *H05K 1/14* | (2006.01) |
| *H03K 19/177* | (2020.01) |
| *H05K 5/00* | (2006.01) |
| *G06F 30/34* | (2020.01) |
| *G06F 30/331* | (2020.01) |

(52) U.S. Cl.
CPC .......... *H05K 1/142* (2013.01); *G06F 30/331* (2020.01); *G06F 30/34* (2020.01); *H03K 19/177* (2013.01); *H05K 5/0069* (2013.01)

(58) Field of Classification Search
CPC ...... H05K 1/142; H05K 5/0069; G06F 30/34; G06F 30/331; H03K 19/177
See application file for complete search history.

(56) References Cited

U.S. PATENT DOCUMENTS

| | | | |
|---|---|---|---|
| 5,114,353 A * | 5/1992 | Sample | H05K 7/1441 439/65 |
| 7,304,500 B2 * | 12/2007 | Chen | H05K 1/141 326/41 |
| 10,852,800 B1 | 12/2020 | Dang et al. | |
| 2001/0023143 A1 * | 9/2001 | Middlehurst | H01R 12/716 439/79 |
| 2004/0066615 A1 * | 4/2004 | Pavesi | G06F 30/331 361/679.55 |
| 2006/0104025 A1 * | 5/2006 | Wabiszczewicz | H05K 7/20154 361/694 |
| 2007/0236906 A1 * | 10/2007 | Hsu | H05K 7/1487 361/810 |
| 2008/0045087 A1 * | 2/2008 | Yi | H01R 12/716 439/637 |

* cited by examiner

*Primary Examiner* — Pete T Lee
(74) *Attorney, Agent, or Firm* — Vista IP Law Group, LLP

(57) ABSTRACT

A mid-plane board including a first connector configured to receive a first signal from a first circuit board is provided. The mid-plane board includes a second connector configured to provide the first signal to a second circuit board. The first circuit board forms a first plane and the second circuit board forms a second plane, and the first plane and the second plane are substantially parallel. The mid-plane board also includes a cutout configured to allow a coplanar connector to bridge the mid-plane board and provide a second signal from the first circuit board to the second circuit board. The second signal is a high-end signal and the first signal is a low-end signal, and the mid-plane board is disposed on a plane substantially orthogonal to the first circuit board and the second circuit board.

20 Claims, 12 Drawing Sheets

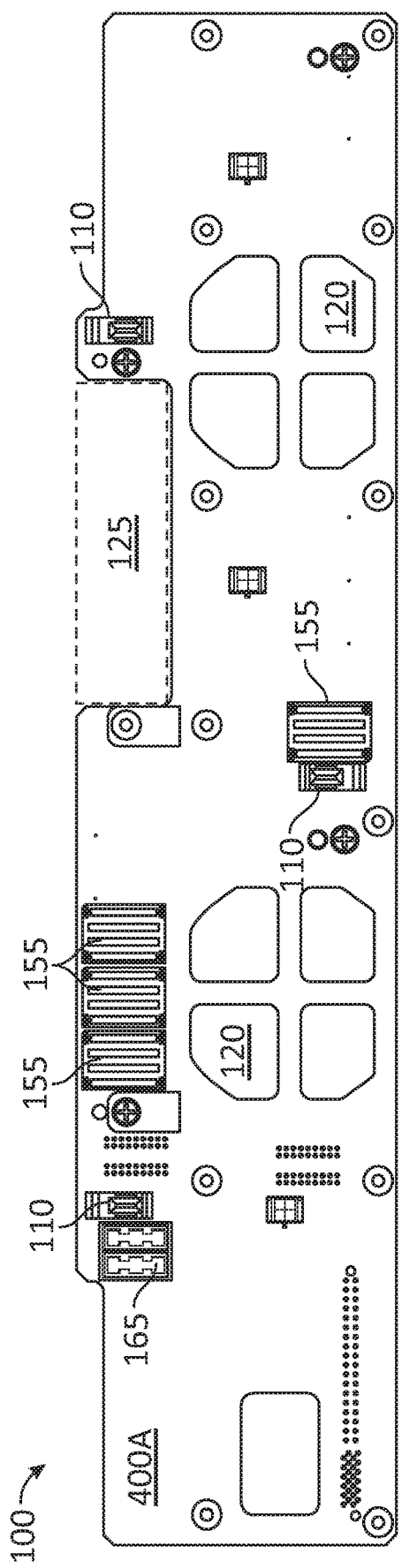
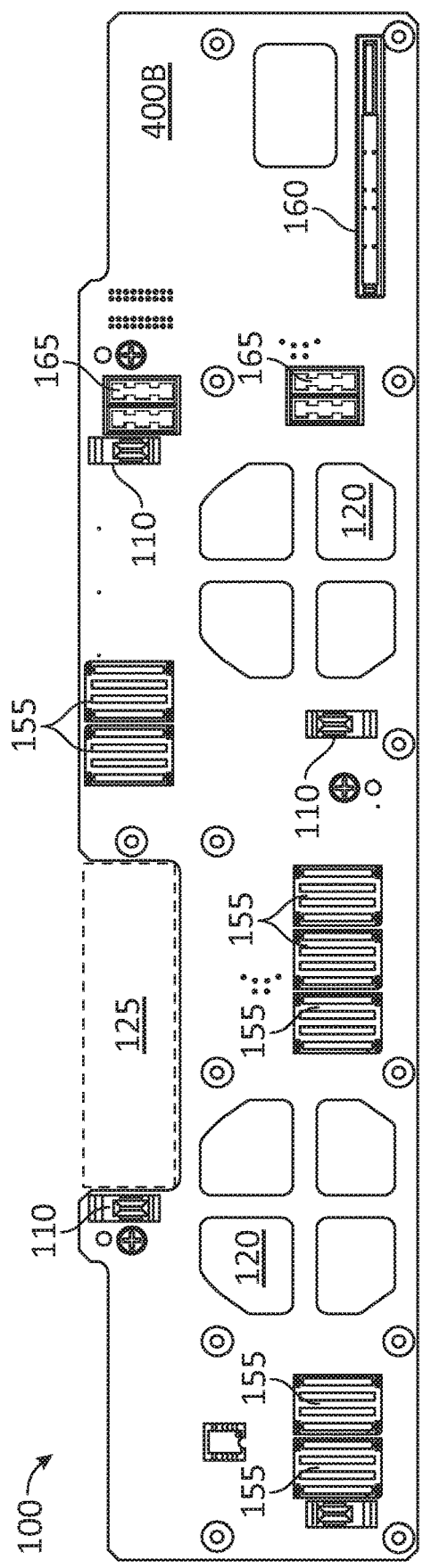
FIG. 4A
FIG. 4B

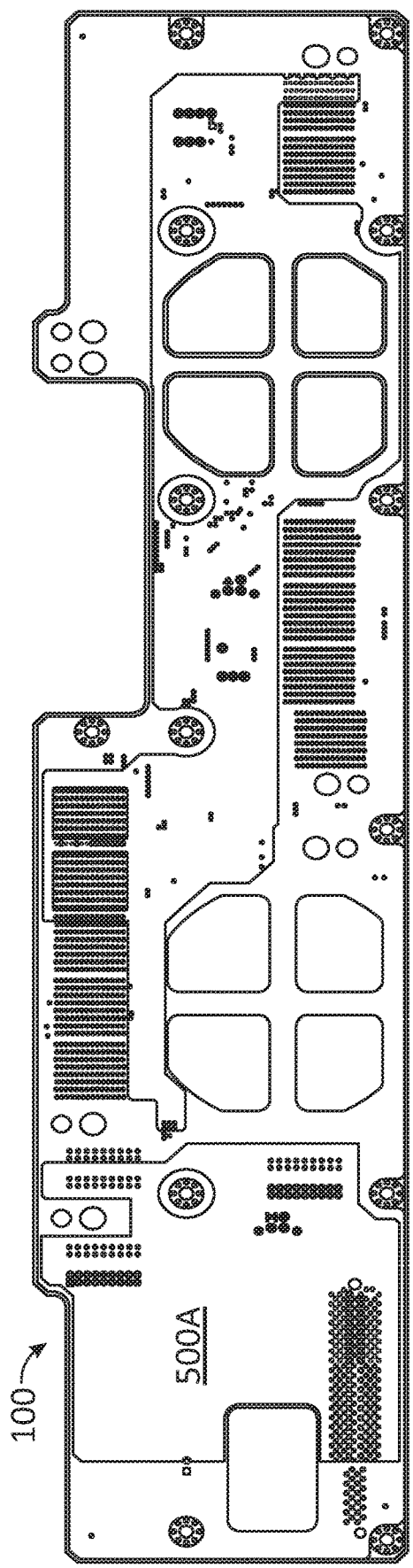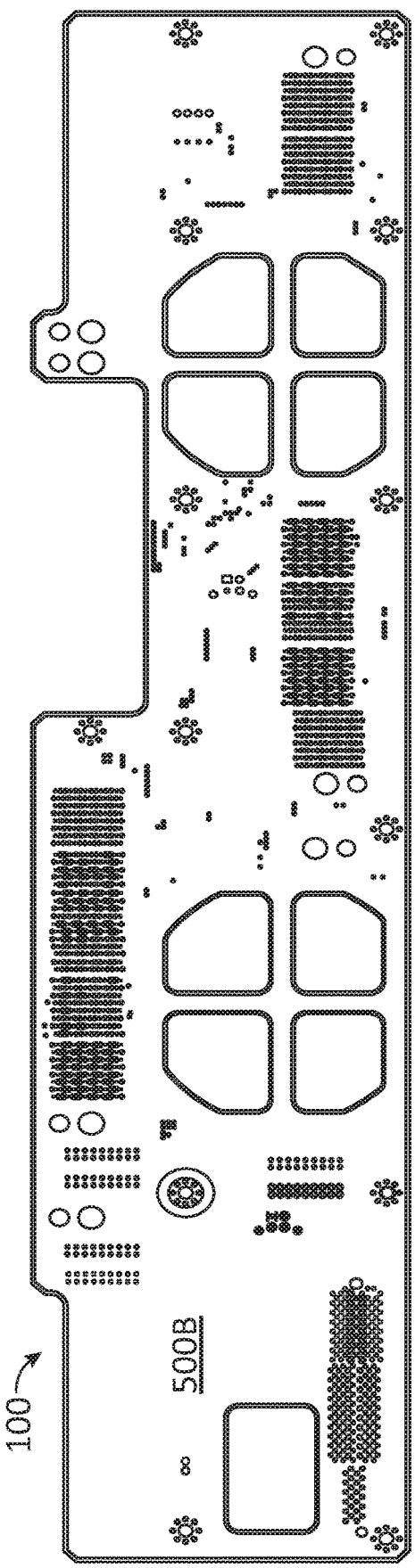

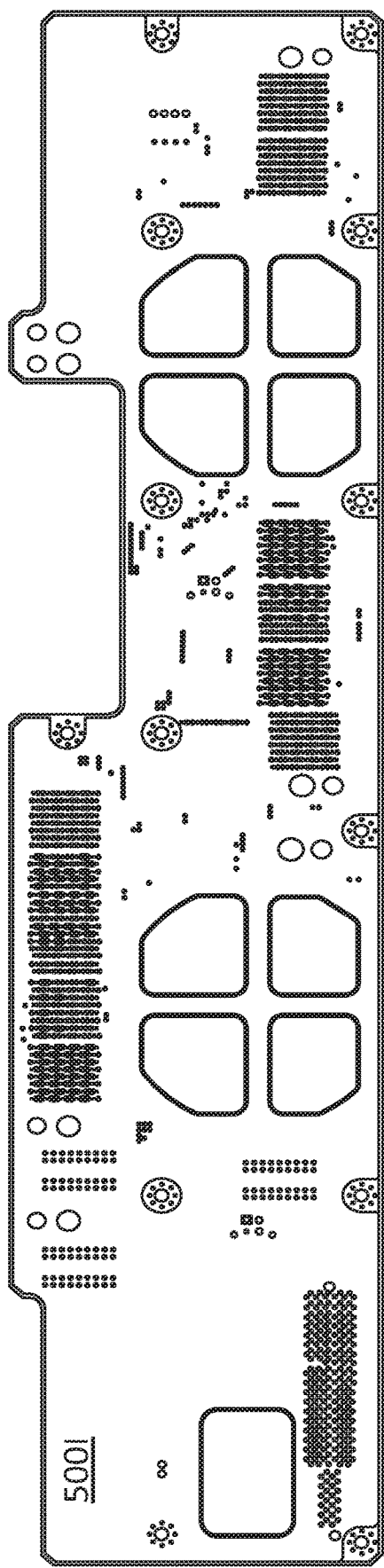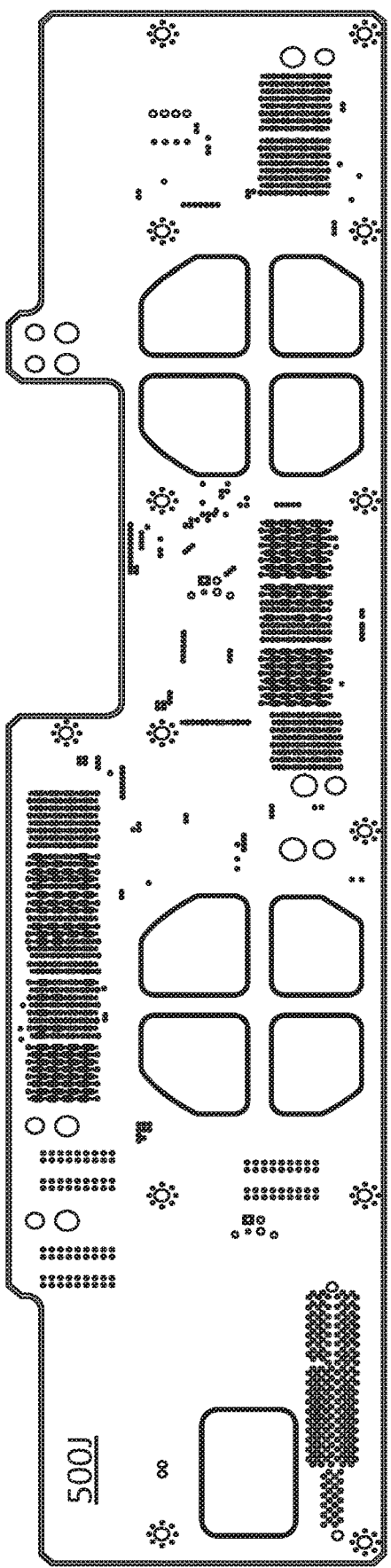

MID-PLANE BOARD FOR COUPLING MULTIPLE CIRCUIT FRAMES IN A CIRCUIT EMULATOR ENGINE

TECHNICAL FIELD

Embodiments described herein are generally related to the field of emulators for integrated circuit modeling and fabrication. More specifically, embodiments described herein are related to systems for accommodating multiple field-programmable gate arrays used in emulators for integrated circuit design.

BACKGROUND

The emulation of current integrated circuit devices is a critical step during device design prior to fabrication. With the evolution of highly sophisticated circuitry, the need for a higher number of gate counts in circuit emulators becomes more pressing. Accordingly, multiple systems attempt to address this problem by separating emulation tasks in time and place, which generates logistical problems and ends up costing the same processing time as a single, lower throughput emulation process.

The description provided in the background section should not be assumed to be prior art merely because it is mentioned in or associated with the background section. The background section may include information that describes one or more aspects of the subject technology.

SUMMARY

In a first embodiment, a mid-plane board includes a first connector configured to receive a first signal from a first circuit board, and a second connector configured to provide the first signal to a second circuit board. The first circuit board forms a first plane and the second circuit board forms a second plane, the first plane and the second plane are substantially parallel. The mid-plane board also includes a cutout configured to allow a coplanar connector to bridge the circuit board and provide a second signal from the first circuit board to the second circuit board. The second signal is a high-end signal and the first signal is a low-end signal and the circuit board is disposed on a plane substantially orthogonal to the first circuit board and the second circuit board.

In a second embodiment, a frame for a device emulator includes a first circuit board including at least a first field-programmable gate array. The frame includes a second circuit board including at least a second field-programmable gate array. The first circuit board forms a first plane and the second circuit board forms a second plane, the first plane and the second plane are substantially parallel. The frame also includes a mid-plane board coupling the first circuit board with the second circuit board. The mid-plane board includes a first connector configured to receive a first signal from the first circuit board and a second connector configured to provide the first signal to the second circuit board. The frame also includes a coplanar connector configured to provide a second signal from the first circuit board to the second circuit board. The mid-plane board has a cutout configured to allow the coplanar connector to bridge the circuit board, the second signal is a high-end signal and the first signal is a low-end signal, and the mid-plane board is disposed on a plane substantially orthogonal to the first plane and the second plane.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments.

In the drawings:

FIGS. 4A-B illustrate front and back plan views of a mid-plane board, according to some embodiments.

Figure 1:
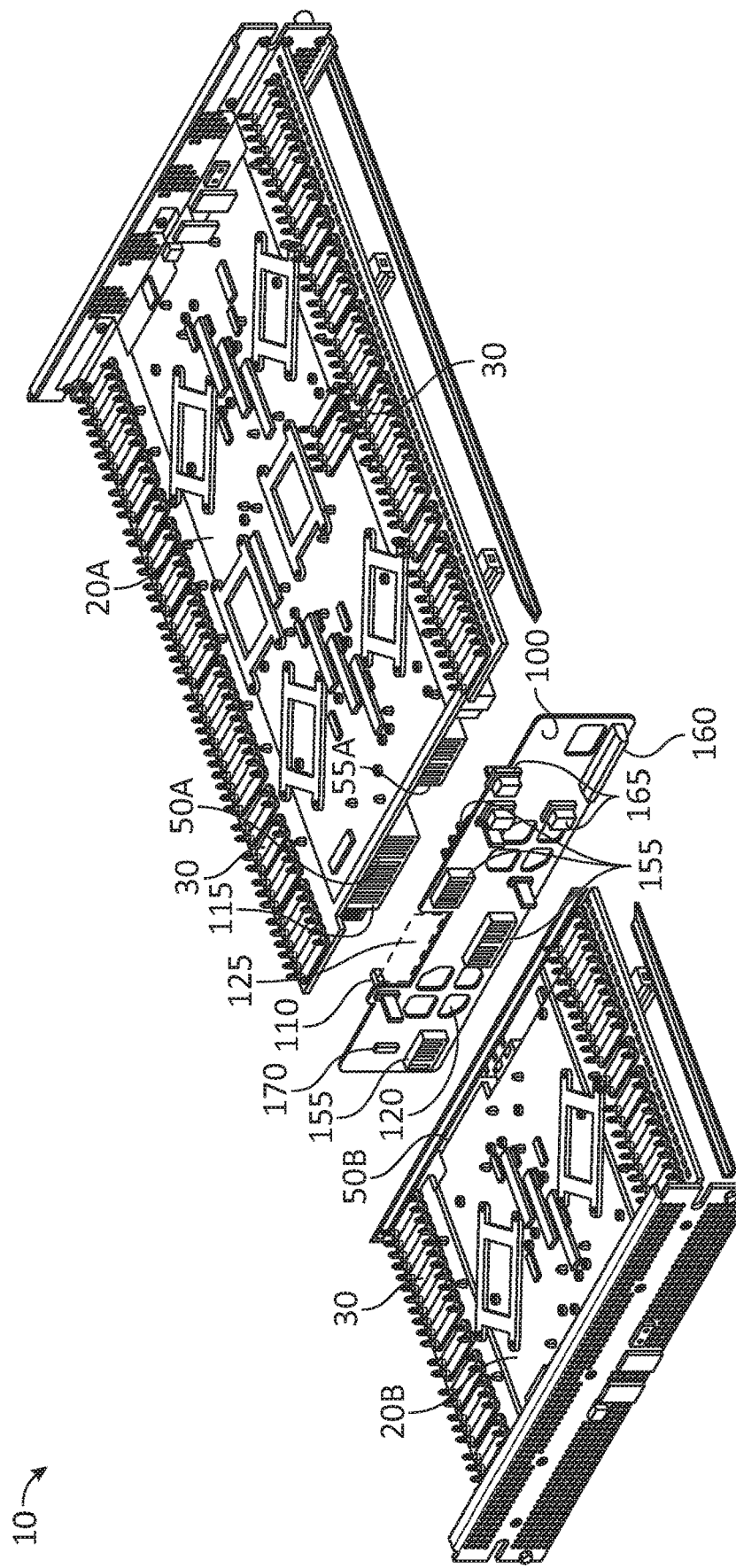
FIG. 1 illustrates a partial perspective of a frame for a device emulator including a mid-plane board with connectors to couple a first circuit board with a second circuit board, according to some embodiments.

In the figures, elements and steps denoted by the same or similar reference numerals are associated with the same or similar elements and steps, unless indicated otherwise. In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

In the field of integrated circuit emulation for complex circuit design, it is highly desirable to achieve compact systems that can emulate an ever-increasing number of gates. The compactness of the emulator system is critical, as the specific signal paths between the multiple emulation gates are precisely synchronized to provide accurate results. Field-programmable gate array (FPGA) devices are typically used in tandem to provide a high number of gate counts for signal emulation. The placement of multiple FPGAs on a single circuit board presents challenges, as each FPGA occupies a significant amount of real-estate, on account of the multiple connectors associated with the gate arrays. Furthermore, the signal paths on the circuit board are carefully selected to avoid uneven time delays and signal skews, as the emulation takes into account multiple netlists interacting with each other on a given integrated circuit. In addition to the above constraints, typical board manufacturers are hesitant to provide excessively large boards that may imply re-tooling of the board factories. Accordingly, embodiments as disclosed herein provide a solution for a compact circuit emulation frame that includes multiple FPGAs arranged in two separate circuit boards. The two circuit boards are coplanar and coupled with one another through a mid-plane board that is disposed perpendicular to the planes of each of the two circuit boards that contain the FPGAs.

In some embodiments, the mid-plane board includes connectors to carry signals from one circuit board through the other, wherein the signals follow conducting tracks formed along multiple conducting layers in the mid-plane board. Accordingly, the traces of the tracks are selected so that signals corresponding to the same group of gates in a circuit netlist have the same travel time from the first circuit board to the second circuit board. This arrangement reduces signal distortion during circuit emulation. To further reduce signal distortion, some embodiments include a direct board-to-board coplanar connector between the first circuit board and the second circuit board. Accordingly, the mid-plane board may have a gap or opening to allow the coplanar connectors to pass through.

FIG. 1 illustrates a partial perspective of a frame 10 for a device emulator, including a mid-plane board 100 with connectors 155 coupling a circuit board 20A with a circuit board 20B (hereinafter, collectively referred to as "circuit boards 20"), according to some embodiments. A first connector 155 receives and transmits a signal to and from circuit board 20A, and a second connector 155 transmits and receives the signal from and to circuit board 20B, respectively. Connector 55A in circuit board 20A is configured to mate with connectors 155 in mid-plane board 100. Similar connectors are disposed on circuit board 20B, mating with connectors 155 in mid-plane board 100. In some embodiments, signals through connectors 155 are low-end signals having a moderate bit rate, e.g., up to a few hundred megabit/second (MBs). Accordingly, low-end signals may tolerate a small amount of distortion created by the inter-coupling of connectors 155 within mid-plane board 100. Each of circuit boards 20 forms a plane substantially parallel with each other. In some embodiments, circuit boards 20 are substantially coplanar. In some embodiments, circuit boards 20, while coplanar, may be perpendicularly offset relative to each other.

A cutout 125 allows a coplanar connector 50A to bridge mid-plane board 100 and provide a second signal from first circuit board 20A to second circuit board 20B. Likewise, coplanar connector 50B may receive the second signal in circuit board 20B. The second signal may also be provided from circuit board 20B to circuit board 20A through coplanar connectors 50B and 50A (hereinafter, collectively referred to as "coplanar connectors 50"). In some embodiments, the second signal is a high-end signal between circuit boards 20A and 20B, e.g., 12.5 gigabit/s (GBs). Mid-plane board 100 is disposed on a plane substantially orthogonal to circuit boards 20. At the opposite side of frame 10 (the bottom of FIG. 1), circuit boards 20 include FPGAs configured to emulate integrated circuit designs based on signals provided by signal connectors 30. Signal connectors 30 may be accessible for a user in a perpendicular direction relative to the planes formed by circuit boards 20.

In some embodiments, mid-plane board 100 includes one or more guide pins 110 protruding perpendicularly and configured to fit on mounting features 115 on each of circuit boards 20. An opening 120 allows an airflow across the mid-plane board. In some embodiments, the airflow is provided by a fan in a power supply (not shown in the figure), the power supply coupled to connector 160.

In some embodiments, mid-plane board 100 includes a power connector 160 configured to receive a power from a power supply. In some embodiments, a power connector 165 on a side of mid-plane board 100 is configured to provide the power to a circuit in circuit board 20A. A power connector 165 on an opposite side of mid-plane board 100 is configured to provide the power to a circuit in a circuit board 20B. Power connectors 165 provide the power to multiple circuits in circuit boards 20, and are disposed on an opposite end of mid-plane board 100 relative to connectors 155, to avoid electromagnetic interference (EMI) between the signals through connectors 155 and the power transmitted through power connectors 165.

In some embodiments, mid-plane board 100 includes a mid-plane identification device 170 storing a manufacturer data and a model number data for the mid-plane board. In some embodiments, mid-plane identification device 170 may include an ID electrically erasable programmable read-only memory circuit (ID EEPROM). In some embodiments, mid-plane board 100 includes multiple openings 120 to allow an air flow across the mid-plane board.

Figure 2:
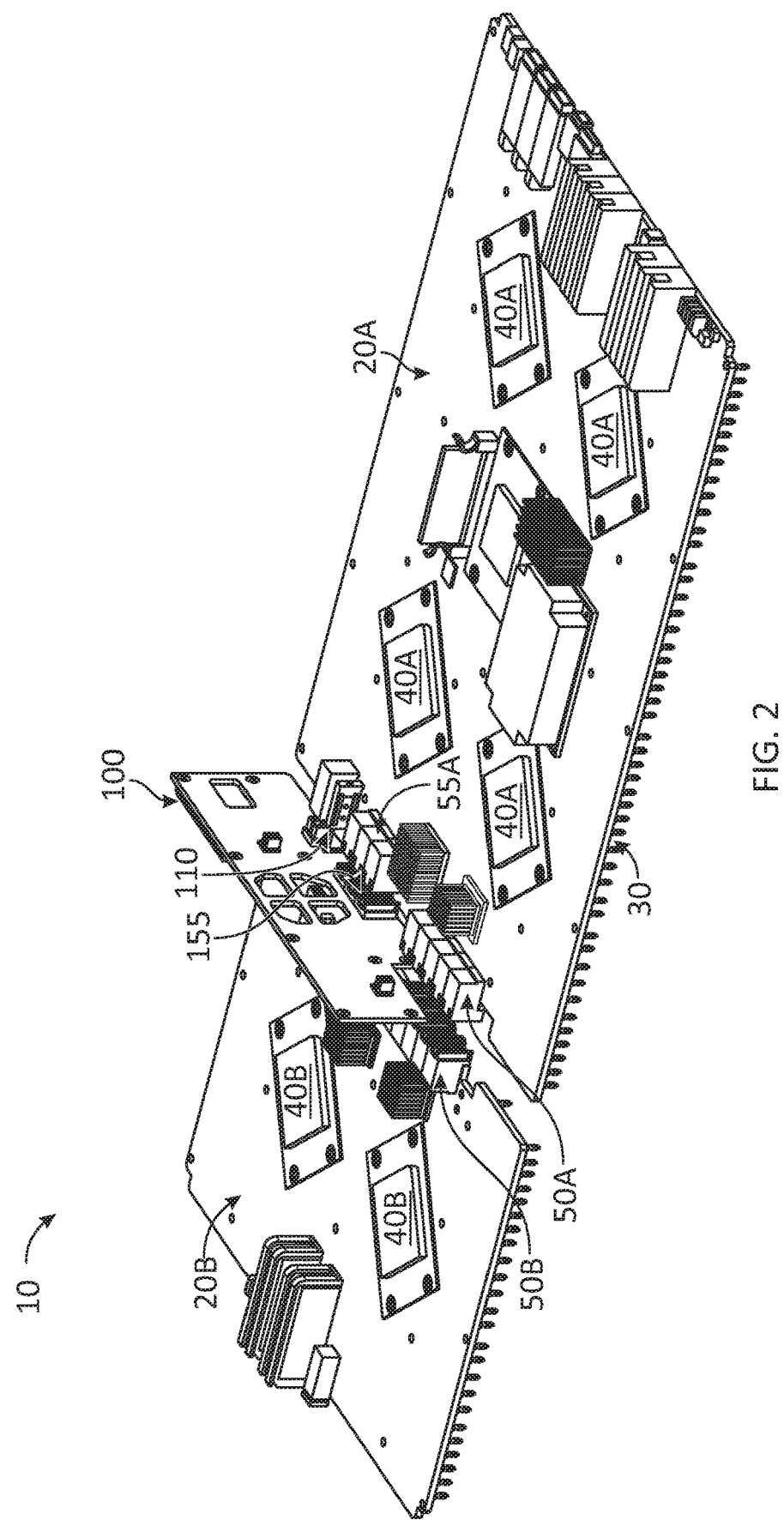
FIG. 2 illustrates a partial perspective of a frame for a device emulator including a mid-plane board with connectors to couple a first circuit board with a second circuit board, according to some embodiments.

FIG. 2 illustrates a partial perspective of frame 10, according to some embodiments. More specifically, FIG. 2 shows the reverse side of the frame illustrated in FIG. 1. Accordingly, FPGAs 40A in circuit board 20A and FPGAs 40B (hereinafter, collectively referred to as "FPGAs 40") are shown together with gate connectors 30, connectors 155, connectors 55A, coplanar connectors 50A and 50B (hereinafter, collectively referred to as "coplanar connectors 50"), and mid-plane board 100. Connectors 55A mate with connectors 155 on mid-plane board 100 (not visible from the perspective of FIG. 2). Guide pins 110 are also shown, engaged securely so as to provide alignment for connectors 155 and 55, and coplanar connectors 50.

Figure 3:
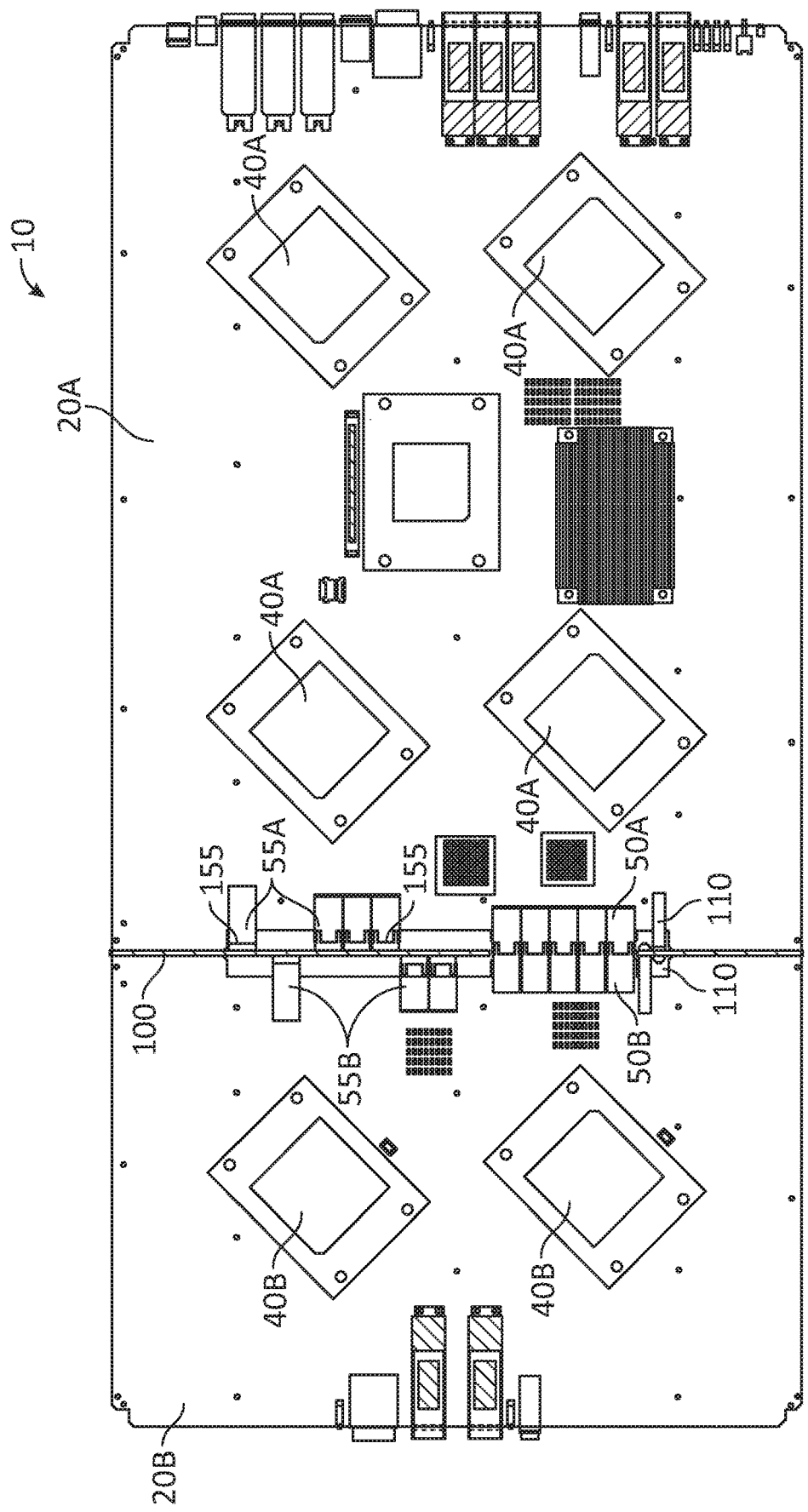
FIG. 3 illustrates a plan view of a frame for a device emulator including a mid-plane board with connectors to couple a first circuit board with a second circuit board, according to some embodiments.

FIG. 3 illustrates a plan view of frame 10, including mid-plane board 100 with connectors 155 to couple circuit board 20A with circuit board 20B, according to some embodiments. Coplanar connectors 50A and 50B couple signals in circuit boards 20 directly, bridging mid-plane board 100. Connectors 55A and 55B couple signals in circuit boards 20 through connectors 155 in mid-plane board 100, as described above. Guide pins 110 and FPGAs 40 are also illustrated for completeness.

FIGS. 4A-B illustrate front face 400A and back face 400B plan views of mid-plane board 100, according to some embodiments. Cutout 125, guide pin 110, connectors 155, and opening 120 are illustrated. Power connectors 160 and 165 are located on a right side of back face 400B of mid-plane board 100 to provide the power to circuits in one of circuit boards 20 (not shown), and a power connector 165 on a left side of front face 400A in mid-plane board 100 to provide the power to a circuit in the other one of circuit boards 20.

In some embodiments, power connectors 160 and 165 are disposed on an opposite end of mid-plane board 100, relative to connectors 155. This configuration enables sufficient distance between power connectors 160 and 165 and signal connectors 155, thus reducing EMI effects.

Figure 5C:
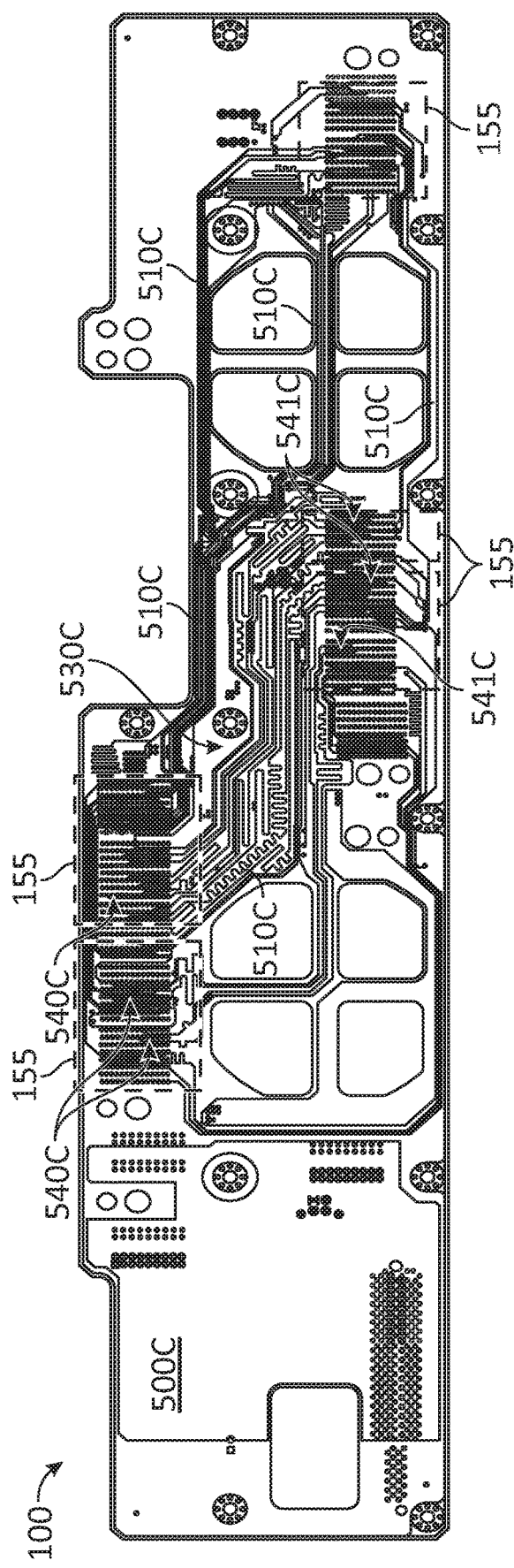
FIGS. 5A-O illustrate multiple conducting layers and dielectric layers in a mid-plane board, according to some embodiments.
Figure 5D:
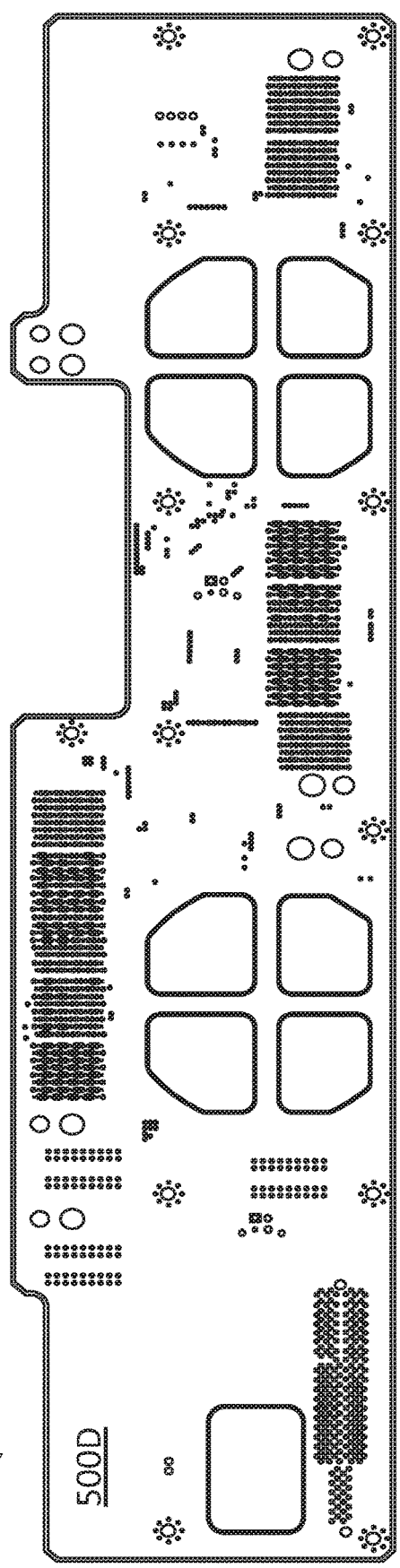
Figure 5E:
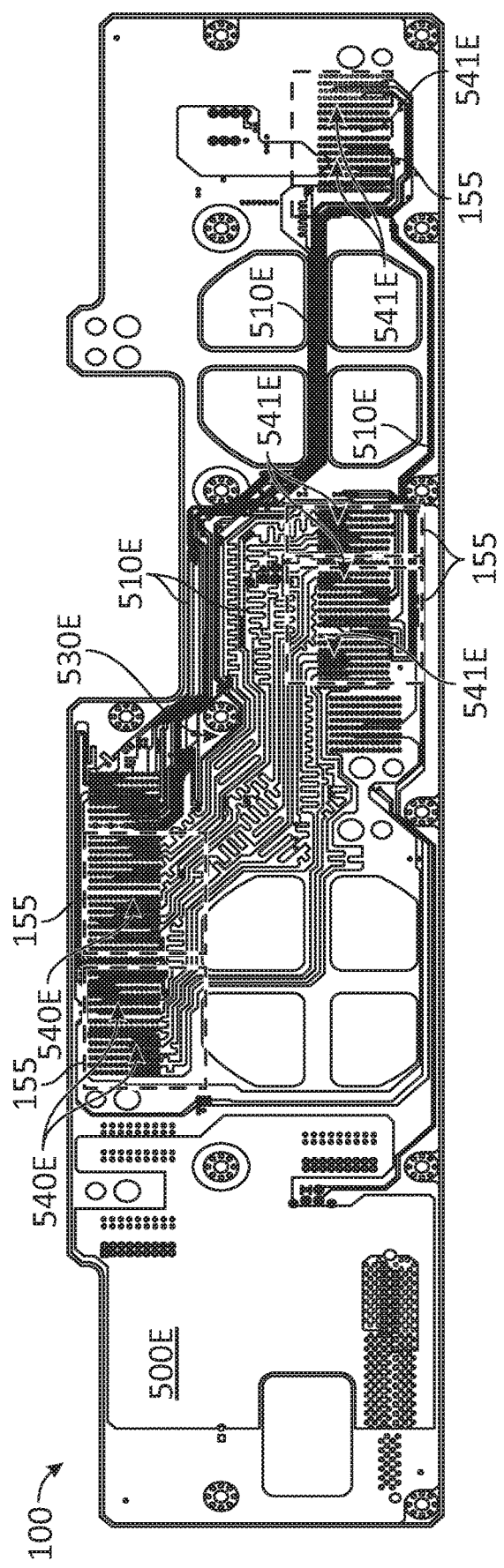
Figure 5F:
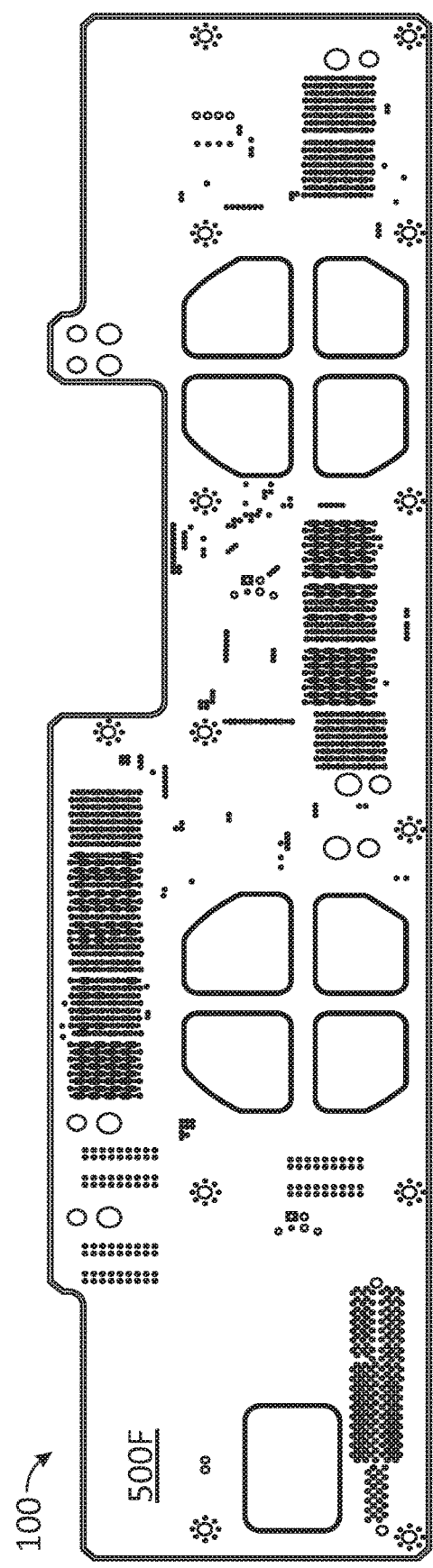
Figure 5G:
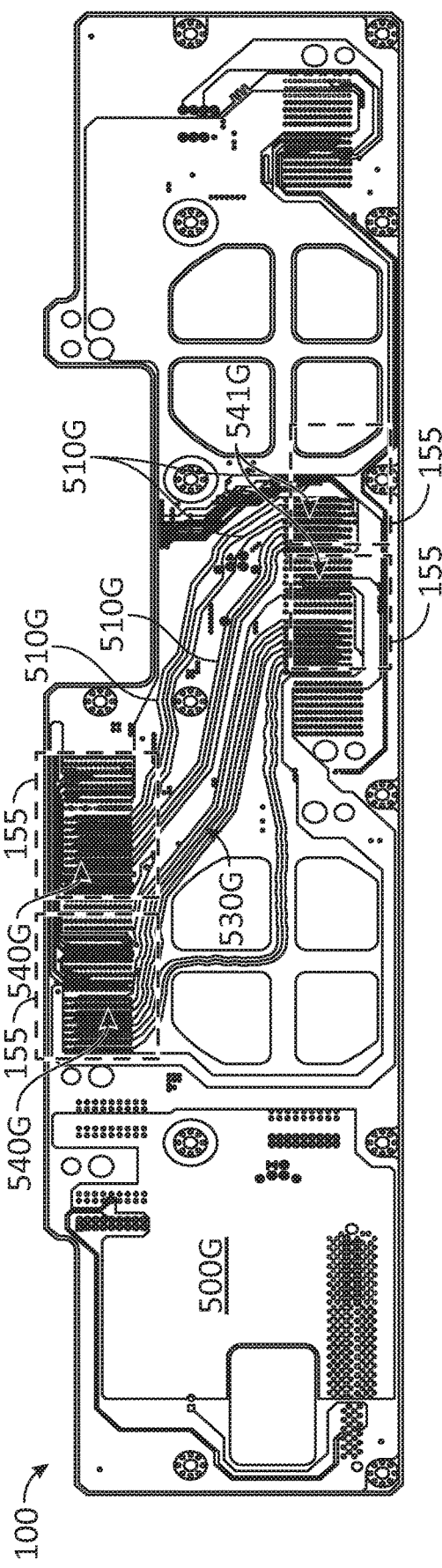
Figure 5H:
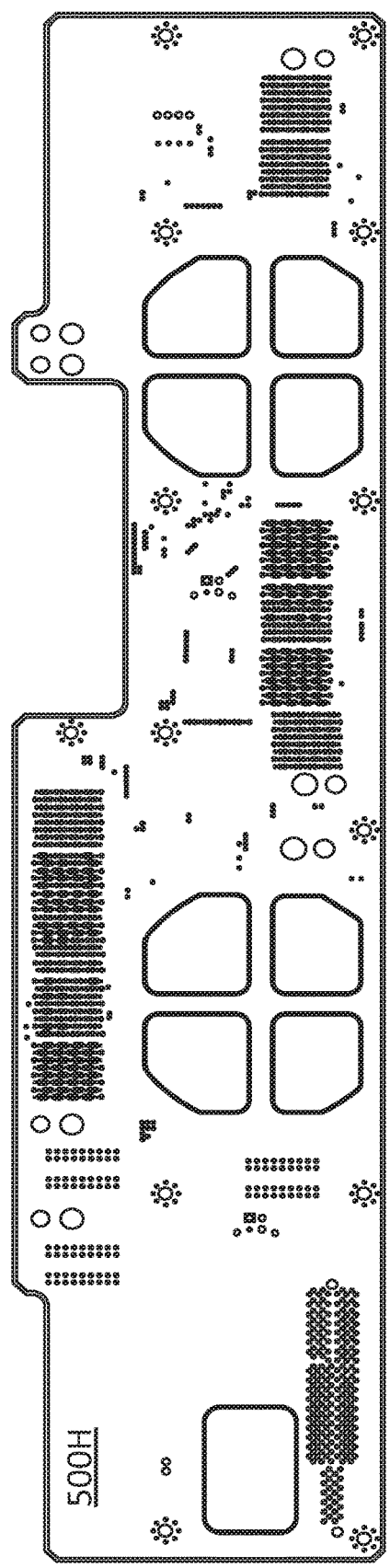
Figure 5K:
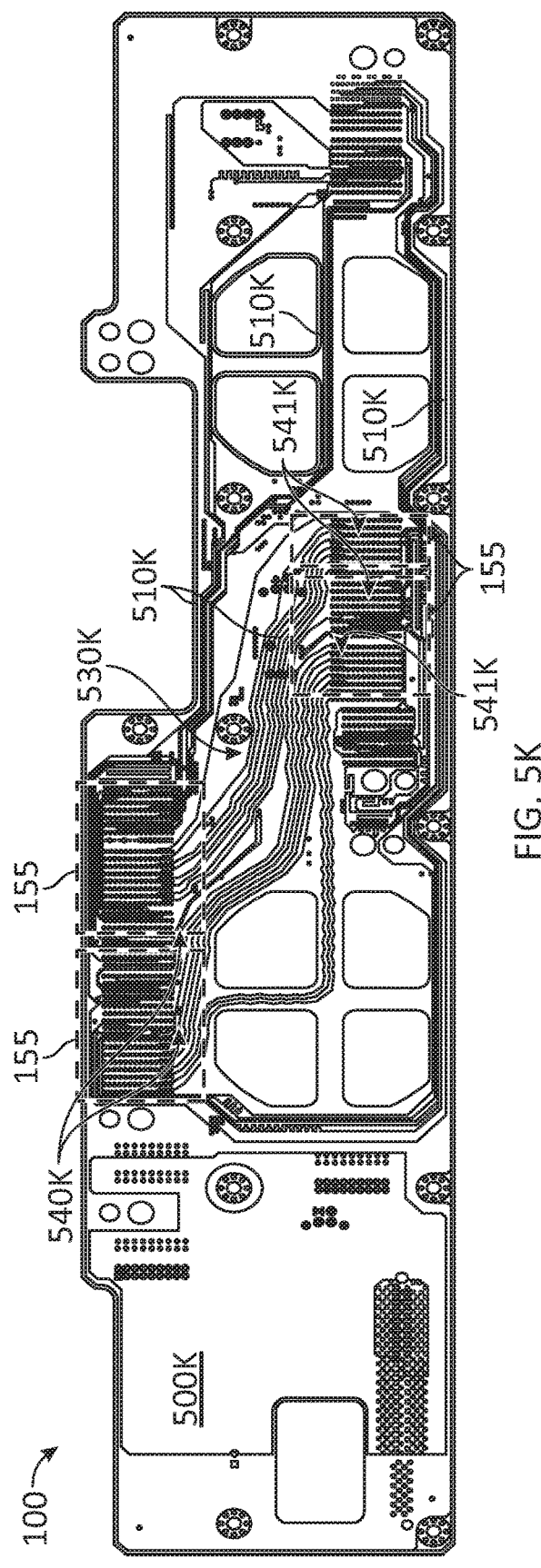
Figure 5L:
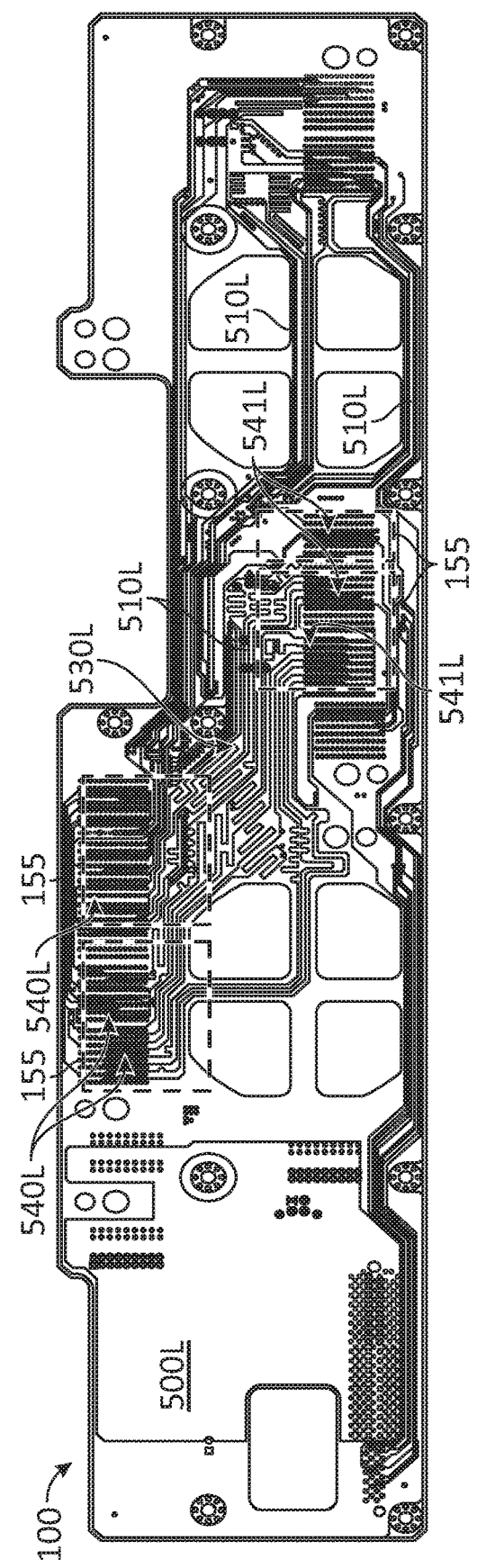
Figure 5M:
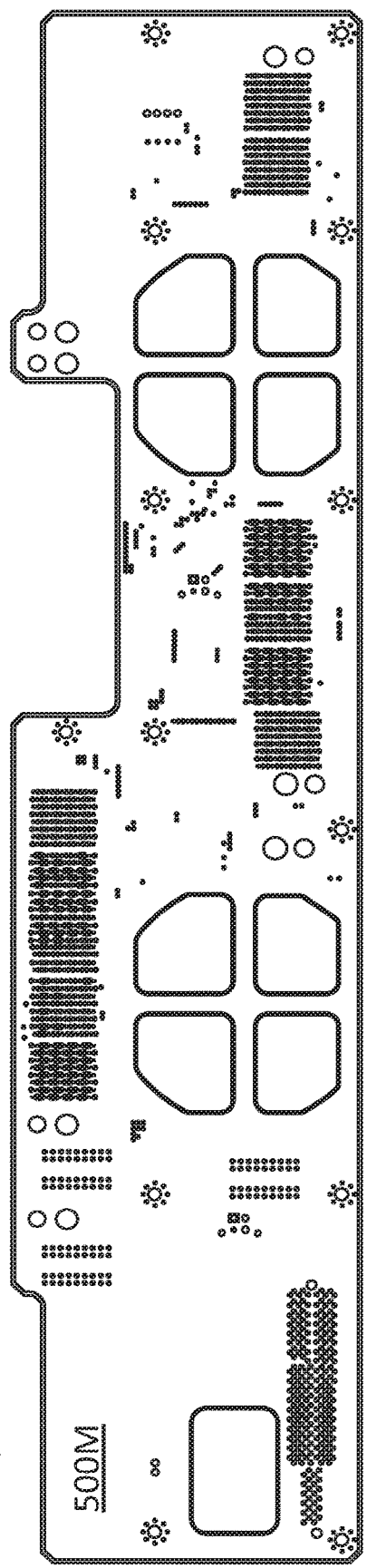
Figure 5N:
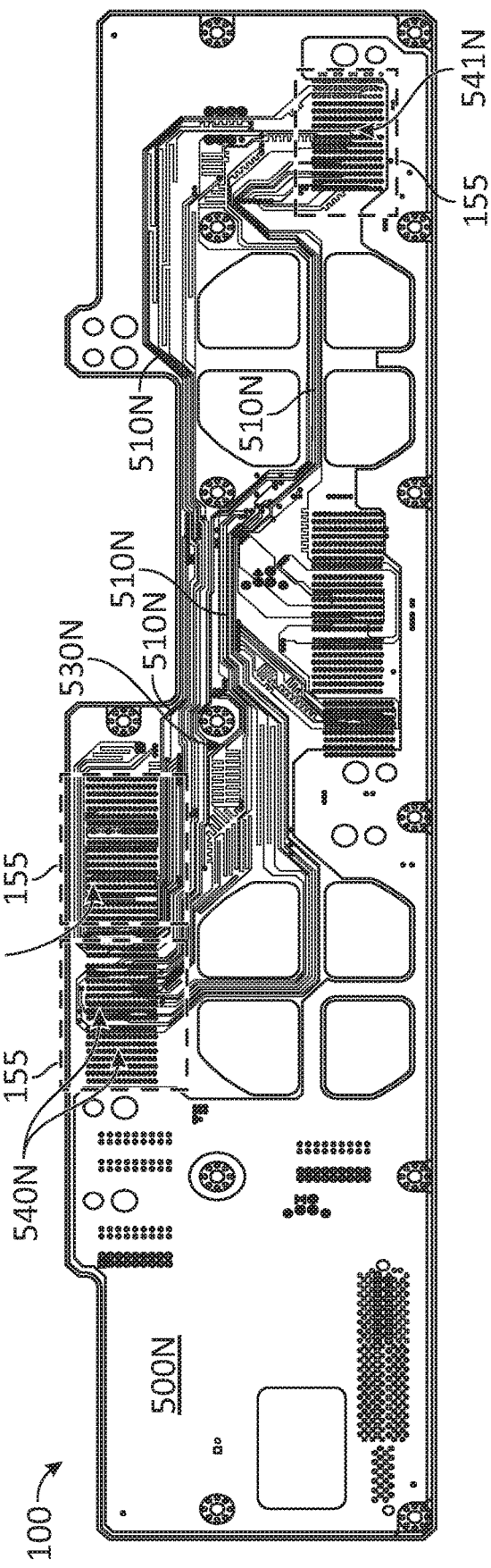
Figure 50:
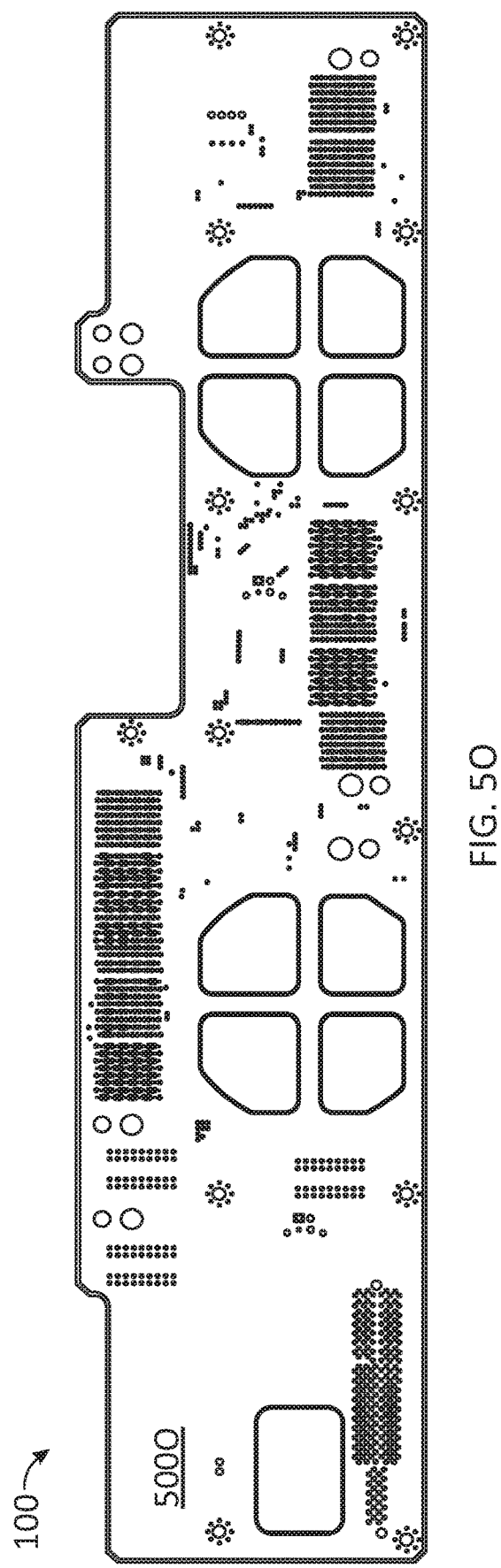

FIGS. 5A-O illustrate multiple conducting traces 510C, 510E, 510G, 510K, 510L, and 510N (hereinafter, collectively referred to as "conducting traces 510"), and dielectric layers 500A-O (hereinafter, collectively referred to as "dielectric layers 500") in a mid-plane board 100, according to some embodiments. Conducting traces 510 provide signals transmitted between the two circuit boards coupled on either face of mid-plane board 100 (e.g., circuit boards 20).

Conducting traces 510 electrically couple connectors 155 from one face of mid-plane board 100 to the opposite face. In some embodiments, conducting traces 510 have a length selected according to a time delay for a signal between a first connector 155 and a second connector 155.

In some embodiments, conducting traces 510 are part of conducting layers 530C, 530E, 530G, 530K, 530L, and 530N (hereinafter, collectively referred to as "conducting layers 530"), which are isolated from each other by dielectric layers 500. Accordingly, in some embodiments, each of conducting layers 530 includes multiple conducting traces 510 from a first group of pins 540C, 540E, 540G, 540K, 540L, and 540N (hereinafter, collectively referred to as "pins 540") in the first connector 155 to a second group of pins 541C, 541E, 541G, 541K, 541L, and 541N (hereinafter, collectively referred to as "pins 541") in the second connector 155.

More generally, conducting traces 510 may include high-speed signals, e.g., peripheral component interconnect express (PCIe) signals, up to several GBs, and low-speed signals (100's of MB's, or less). In the figures, and for illustrative purposes only, at least some of traces 510L are associated with low speed signals. On the other hand, at least some of 510K traces joining pins 540K and 541K are differential high speed PCIe signals. Also, at least some of 510C traces joining pins 540C and 541C are differential pairs for clock signals. And some of 510G traces joining pins 540G and 541G are high speed PCIe signals.

Furthermore, in some embodiments, conducting traces 510 joining the same group of pins 540 and pins 541 have a same length (e.g., differential pairs for clock signals), to guarantee no signal skew between the gates in the FPGAs (e.g., FPGAs 40) associated to those pins on either side of mid-plane board 100. For example, in some embodiments at least some of conducting traces 510 may include turns and meandering tracks ("serpentine-shaped") to ensure an appropriate length consistent with a travel time of signals between pins 540 and pins 541. Some of traces 510 joining pins 540 and 541 are clock differential traces and are matched by serpentine adjustments. For example, traces 510C include meandering patterns between pins 540C and 541C, to avoid signal skew between different traces when signals are transmitted between the two circuit boards. Serpentine-shaped traces may be matched length traces, but not all are associated with high-speed signals. For example, at least some of traces 510N reaching pins 541N are configured for low-speed signals.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A mid-plane board, comprising:
   a first connector configured to receive a first signal from a first circuit board, and a second connector configured to provide the first signal to a second circuit board, wherein the first circuit board forms a first plane and the second circuit board forms a second plane, the first plane and the second plane are parallel;
   multiple conducting layers isolated from each other by dielectric layers, wherein each of the multiple conducting layers includes multiple connections from a first group of pins in the first connector to a second group of pins in the second connector, and wherein the connections have a same length; and
   a cutout configured to allow a coplanar connector to bridge the mid-plane board and provide a second signal from the first circuit board to the second circuit board, wherein
   the second signal operates at a higher frequency than the first signal,
   the mid-plane board is disposed on a plane orthogonal to the first circuit board and the second circuit board, and
   the cutout is in a location different from a location of the first connector and a location the second connector.

2. The mid-plane board of claim 1, wherein the first plane and the second plane are coplanar relative to each other.

3. The mid-plane board of claim 1, further comprising multiple conducting traces electrically coupling the first connector with the second connector, the conducting traces having a length corresponding to a time delay for a signal between the first connector and the second connector.

4. The mid-plane board of claim 1, wherein the multiple connections for at least one conducting layer of the multiple conducting layers comprises multiple conducting traces.

5. The mid-plane board of claim 1, further comprising guide pins protruding perpendicularly from the mid-plane board and configured to fit on mounting features on each of the first circuit board and the second circuit board.

6. The mid-plane board of claim 1, further comprising a first power connector to receive a power from a power supply, a second power connector on a first face of the mid-plane board to provide the power to a circuit in the first circuit board, and a third power connector on a second face of the mid-plane board opposite a first side of the mid-plane board to provide the power to a circuit in a second circuit board.

7. The mid-plane board of claim 1, further comprising power connectors to receive power from a power supply and to provide the power to multiple circuits in the first circuit board and the second circuit board, wherein the power connectors are disposed on an opposite end of the mid-plane board relative to the first connector and the second connector.

8. The mid-plane board of claim 1, further comprising a mid-plane identification device storing a manufacturer data and a model number data for the mid-plane board.

9. The mid-plane board of claim 1, further comprising an opening to allow airflow across the mid-plane board.

10. A frame for a device emulator, comprising:
    a first circuit board including at least a first field-programmable gate array;
    a second circuit board including at least a second field-programmable gate array, wherein the first circuit board forms a first plane and the second circuit board forms a second plane, the first plane and the second plane are parallel; and
    a mid-plane board coupling the first circuit board with the second circuit board, the mid-plane board comprising:
       a first connector configured to receive a first signal from the first circuit board,
       a second connector configured to provide the first signal to the second circuit board, and
       multiple conducting layers isolated from each other by dielectric layers, wherein each of the multiple conducting layers includes multiple connections from a first group of pins in the first connector to a second group of pins in the second connector, and wherein the connections have a same length; and
    a coplanar connector configured to provide a second signal from the first circuit board to the second circuit board, wherein:
    the mid-plane board has a cutout configured to allow the coplanar connector to bridge the mid-plane board,
    the second signal operates at a higher frequency than the first signal,
    the mid-plane board is disposed on a plane orthogonal to the first plane and the second plane, and
    the cutout is in a location different from a location of the first connector and a location the second connector.

11. The frame of claim 10, wherein the first plane and the second plane are coplanar relative to each other.

12. The frame of claim 10, wherein the mid-plane board further comprises guide pins protruding perpendicularly and configured to fit on mounting features on each of the first circuit board and the second circuit board.

13. The frame of claim 10, wherein the mid-plane board comprises multiple conducting traces electrically coupling the first connector with the second connector, the conducting traces having a length corresponding to a time delay for a signal between the first connector and the second connector.

14. The frame of claim 10, wherein the multiple connections for at least one conducting layer of the multiple conducting layers comprises multiple conducting traces.

15. The frame of claim 10, wherein the mid-plane board further comprises a power connector configured to receive power from a power supply, a second power connector on a first side of the mid-plane board to provide the power to a circuit in the first circuit board, and a third power connector on a second side of the mid-plane board opposite the first side of the mid-plane board to provide the power to a circuit in a second circuit board.

16. The frame of claim 10, wherein the mid-plane board further comprises power connectors to receive a power from a power supply and to provide the power to multiple circuits in the first circuit board and the second circuit board, wherein the power connectors are disposed on an opposite end of the mid-plane board relative to the first connector and the second connector.

17. The frame of claim 10, wherein the mid-plane board further comprises a mid-plane identification circuit including a manufacturer and a model number for the mid-plane board.

18. The frame of claim 10, wherein the mid-plane board further comprises an opening to allow airflow across the mid-plane board.

19. The frame of claim 10, wherein the first circuit board and the second circuit board comprise multiple signal connectors accessible for a user in a perpendicular direction relative to the planes that are parallel to each other.

20. The frame of claim 10, wherein the planes that are parallel relative to each other are perpendicularly offset relative to the mid-plane board.

* * * * *